United States Patent
Levin et al.

(10) Patent No.: US 7,544,557 B2
(45) Date of Patent: Jun. 9, 2009

(54) GATE DEFINED SCHOTTKY DIODE

(75) Inventors: Sharon Levin, Haifa (IL); Shye Shapira, Haifa (IL); Ira Naot, Zikhron Yaakov (IL); Robert J. Strain, San Jose, CA (US); Yossi Netzer, Hadera (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 470 days.

(21) Appl. No.: 11/255,627

(22) Filed: Oct. 21, 2005

(65) Prior Publication Data

US 2006/0125019 A1    Jun. 15, 2006

Related U.S. Application Data

(60) Provisional application No. 60/636,693, filed on Dec. 15, 2004.

(51) Int. Cl.
*H01L 21/8238* (2006.01)
(52) U.S. Cl. .................... 438/199; 438/200; 438/210; 438/380; 257/577; 257/624; 257/E21.053; 257/E21.358; 257/E21.359
(58) Field of Classification Search ............. 257/104, 257/557, 624; 438/200, 210, 199, 380
See application file for complete search history.

(56) References Cited

U.S. PATENT DOCUMENTS

| 5,347,161 | A | 9/1994 | Wu et al. | |
| 6,825,073 | B1 | 11/2004 | Wu | |
| 2003/0181011 | A1* | 9/2003 | Curro et al. | 438/270 |
| 2004/0012066 | A1* | 1/2004 | Dietl et al. | 257/471 |

* cited by examiner

*Primary Examiner*—M. Wilczewski
*Assistant Examiner*—Tsz K Chiu
(74) *Attorney, Agent, or Firm*—Bever, Hoffman & Harms, LLP; Patrick T. Bever

(57) ABSTRACT

A Schottky diode exhibiting low series resistance is efficiently fabricated using a substantially standard CMOS process flow by forming the Schottky diode using substantially the same structures and processes that are used to form a field effect transistor (FET) of a CMOS IC device. Polycrystalline silicon, which is used to form the gate structure of the FET, is utilized to form an isolation structure between the Schottky barrier and backside structure of the Schottky diode. Silicide (e.g., cobalt silicide ($CoSi_2$)) structures, which are utilized to form source and drain metal-to-silicon contacts in the FET, are used to form the Schottky barrier and backside Ohmic contact of the Schottky diode. Heavily doped drain (HDD) diffusions and lightly doped drain (LDD) diffusions, which are used to form source and drain diffusions of the FET, are utilized to form a suitable contact diffusion under the backside contact silicide.

6 Claims, 4 Drawing Sheets

GATE DEFINED SCHOTTKY DIODE

RELATED APPLICATIONS

This application claims priority of U.S. Provisional Patent Application 60/636,693, entitled "Cobalt Silicide On Lightly Doped Silicon Diode Embedded In Standard CMOS Flow For High Frequency And Mixed Signal Applications" filed Dec. 15, 2004.

FIELD OF THE INVENTION

This invention relates to integrated circuits (ICs), more particularly, to complementary metal oxide semiconductor (CMOS) ICs that incorporate Schottky diodes.

BACKGROUND OF THE INVENTION

Schottky diodes are important passive components in, for example CMOS ICs that perform radio frequency (RF) and mixed signal (MS) functions. CMOS Schottky diodes include two terminals, an anode and a cathode, that are formed on a surface of the CMOS integrated circuit substrate (e.g., monocrystalline silicon), and also include isolation structure positioned between the anode and cathode. The Schottky diode consists a Schottky barrier, which is a metallic region, in direct contact with a relatively lightly doped semiconducting region, a method providing an ohmic contact to that lightly doped semiconducting region, which will be called a backside contact, and the structures necessary to define and isolate the two different contact regions. According to the choice of substrate doping and the metallic material, the metallic region may be either a cathode or an anode. When the metallic material is in contact with a P-type region, it takes the role of cathode. On the other hand, if the metallic material is in contact with N-type silicon, it takes the role of an anode. In either case, the Schottky diode is completed with an ohmic contact to the underlying semiconductor region. When the Schottky diode is biased so that the anode is positive with respect to the cathode, and when a sufficient bias voltage exists between the Schottky barrier and the Ohmic contact, a relatively high current is produced that passes through the intervening substrate. When the anode is biased negatively with respect to the cathode, a much reduced, reverse current flows. Like all diodes, the Schottky diode is subject to breakdown if excessive reverse voltage is applied. The magnitudes of the forward and reverse currents are determined first by the choice of N-type or P-type semiconducting material, second by the choice of metallic material, third by the doping density of the semiconducting material, and finally by the details of the device geometry.

Due to the general trend toward RF and MS CMOS ICs that function at ever-lower operating voltages, there is a need for passive components, such as Schottky diodes, that exhibit a sufficiently low turn on voltage and low series resistance. These Schottky diode operating characteristics can be "tuned" to a desired level through the selection of either N-type or P-type doping for the semiconducting region, the selection of metallic material used to form the Schottky barrier and ohmic contact, the doping levels of the diode well, and the distance between the anode and cathode (i.e., the width of the isolation structure).

The present invention is particularly directed to reducing the series resistance of a Schottky diode in a way that minimizes interruption of a standardized CMOS process flow. In conventional Schottky diode fabrication, the isolation structure between the anode and cathode is formed using well-known shallow trench isolation (STI) or localized oxidation (LOCOS) techniques. Both LOCOS and STI structures are used in a CMOS process flow to, for example, to electrically isolate individual components from neighboring components. Since the more advanced processes use STI, the balance of this discussion will address STI. A problem with using an STI structure as a Schottky diode isolation structure is that STI structures are relatively wide (when compared with other lithographically formed IC structures) and extend into the substrate, thereby creating a relatively long current flow path between the Schottky diode's anode and cathode. Because series resistance is directly related to this current flow path, it is difficult to reduce the series resistance of Schottky diodes formed with STI-based isolation structures. This problem is particularly severe with small diodes that are appropriate to high frequency RF applications.

What is needed is a method for fabricating Schottky diodes for RF and MS CMOS ICs in which series resistance is minimized in order to facilitate low voltage operation. What is also needed is a method for producing such Schottky diodes that can be incorporated into a standard CMOS processing flow and in a manner that reduces the number of additional processing steps, thus maintaining the lowest production cost possible for such a diode and integrated circuits incorporating the diode.

SUMMARY OF THE INVENTION

The present invention is directed to a gate-defined Schottky diode that utilizes a "gate-like" polycrystalline silicon isolation structure formed on the substrate surface in place of the conventional STI-type isolation structure, thereby facilitating a reduction in the current path between the anode and cathode, thus reducing the Schottky diode's series resistance. In addition, the present invention is directed to CMOS ICs including gate-defined Schottky diodes wherein the "gate-like" polycrystalline silicon isolation structure is formed simultaneously with the gate structure of CMOS FETs, thereby facilitating production of the Schottky diode with minimal interruption to a standard CMOS processing flow, thus maintaining the lowest possible production cost.

In accordance with a first aspect of the invention, the Schottky diode isolation structures are substantially identical to the FET gate structures. In particular, similar to conventional FET gate structures, the Schottky diode isolation structures include a thin lower oxide layer, a doped polycrystalline silicon structure formed on lower oxide layer, oxide structures formed on opposing side walls of the polysilicon structure, and an optional silicide structure formed on an upper surface of the polysilicon structure. By forming the Schottky diode isolation structures using the same structures and processes utilized to form the FET gate structures, the fabrication of Schottky diodes in accordance with the present invention can be carried out with minimal interruption or variation to a standardized CMOS process flow.

In accordance with a second aspect of the invention, the Schottky diode's anode and cathode are formed using the same structures and process steps as those used to form FET source and drain terminals. In one embodiment, silicide structures (e.g., one of cobalt silicide, titanium silicide, and nickel silicide) are simultaneously formed over the anode/cathode regions of the Schottky diodes and the source/drain regions of the FETs. In addition, the Schottky diodes' anode and cathode structures respectively include "backside" metallization contacts that are formed simultaneously with metal contacts to the source/drain terminals of the FETs. By forming the anode/cathode structures of Schottky diode using the same structures and processes utilized to form the FET source/drain terminals, the fabrication of Schottky diodes in accordance with the present invention can be carried out substantially simultaneously with the formation of FETs during a standardized CMOS process flow.

According to a third aspect of the present invention, the diffusions and implants which are normally used to define the transistor characteristics are used to realize the desired Schottky diode characteristics. For instance, the n-well conventionally used to create a PMOS transistor can be used to create a Schottky diode wherein the metallic region is its anode, i.e., it is forward biased when the metallic region is positive. Conversely, the p-well conventionally used to form an NMOS transistor can be used to create a Schottky diode wherein the metallic region is its cathode. In those processes where different threshold adjusting implants are employed, choosing among those implants allows the Schottky characteristics to be further refined in terms of its forward and reverse conduction characteristics. It is also possible to use other standard implants to refine the Schottky diode characteristics, like the "lightly doped drain" implant. As long as the implants already are defined by a dedicated mask in the base CMOS process, their use in fine tuning the Schottky characteristics adds no process cost.

According to a fourth aspect of this invention, the contact to the semiconducting region of the Schottky diode is formed using the same dopant concentrations and the same processing steps as those used to form the contacts to the FET source/drain diffusion regions. In particular, the same implants and diffusions used to form the sources and drains for PMOS transistors are used to contact the semiconducting regions associated with a Schottky diode formed on a relatively lightly doped P-type semiconducting region. Alternatively, the same implants and diffusions used to form NMOS transistors are used to for contacts to the semiconducting regions of Schottky diodes formed on relatively lightly doped N-type semiconducting regions. The heavy doping associated with source and drain contacts must be excluded from the region in which the Schottky diode is formed. By using the same processes and concentrations to form both the Schottky diode semiconducting region contact diffusions and the FET source/drain diffusions, the present invention further facilitates the simultaneous fabrication of Schottky diodes and FETs during a standardized CMOS process flow.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

As used herein, the terms "doped region", "implant", and "well" refer to contiguous regions of a semiconductor substrate that are characterized by a predominance of a selected dopant type (i.e., P-type or N-type) that produces a desired conductance in a manner well known in the art. For convenience, regions exhibiting this predominance of P-type or N-type carriers are referred to herein as having a P-type or N-type doping concentration, or having a P- or N-conductivity type. The terms "P+" and "N+" are used herein to denote such regions/implants/wells of relatively high doping concentrations, and the terms "P−" and "N−" are used herein to denote such regions/implants/wells of relatively low doping concentrations. In addition, directional terms such as "upper", "under" and "over" are intended to provide relative positions for purposes of description, and are not intended to designate an absolute frame of reference.

Figure 1:
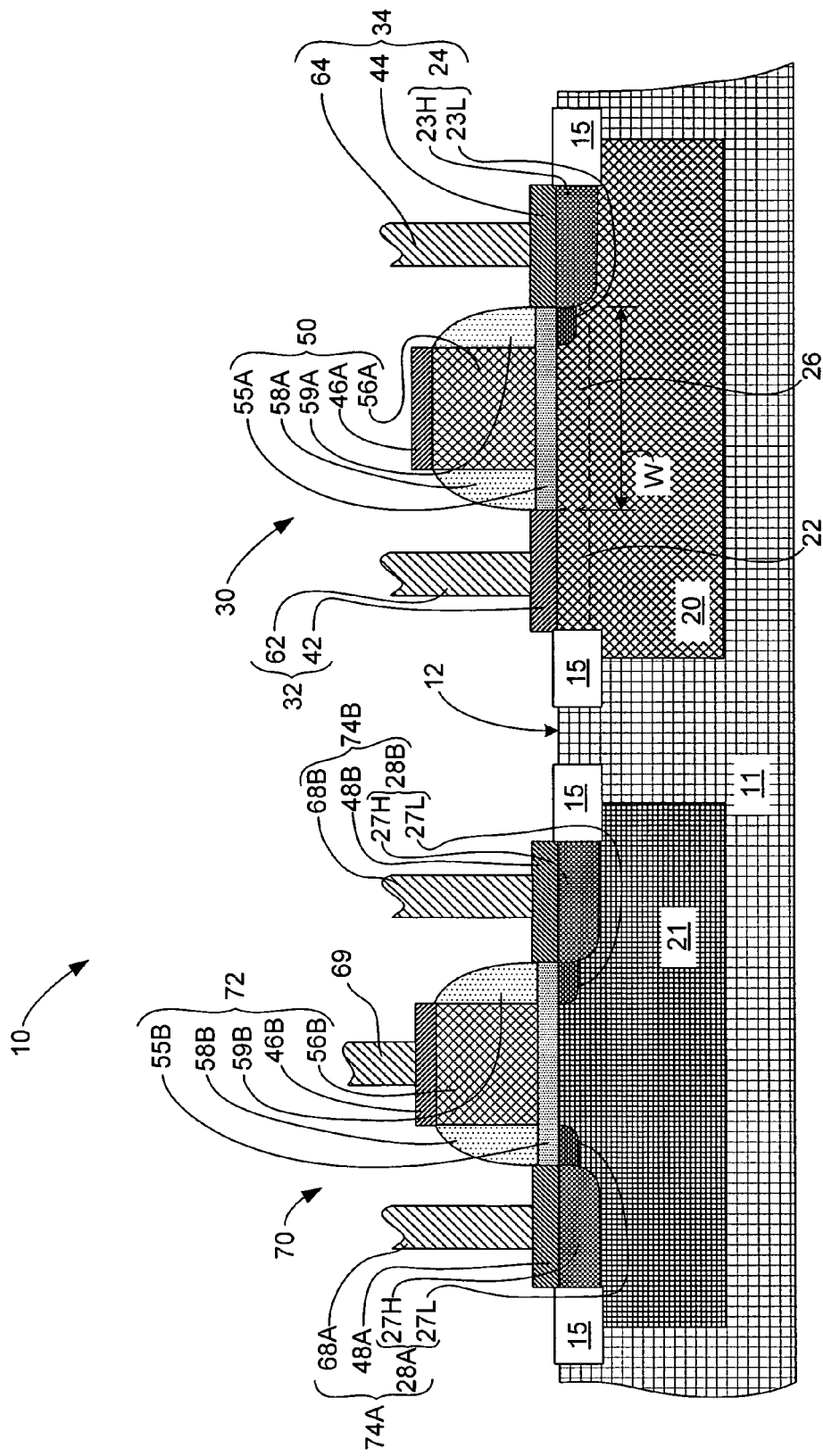
FIG. 1 is a cross-sectional side view showing a CMOS IC device including a simplified Schottky diode and a CMOS FET according to an embodiment of the present invention.

FIG. 1 is a cross-sectional side view showing a simplified complimentary complementary metal-oxide-semiconductor integrated circuit (CMOS IC) device 10 including a Schottky diode 30 and a CMOS field effect transistor (FET) 70 formed on a substrate 11 in accordance with an exemplary embodiment of the present invention. Schottky diode 30 and a CMOS FET 70 are illustrated in simplified form in FIG. 1 in order to emphasize the common structures and shared features associated with these component types. The position of Schottky diode 30 relative to a CMOS FET 70, and the shapes and locations of the structures associated with these components, are selected for explanatory purposes.

In one embodiment, substrate 11 is a doped (i.e., P-type or N-type) monocrystalline silicon wafer "chip" having an upper surface 12, and includes a (first) well region 20 that is exposed on a portion of surface 12, and is otherwise surrounded by substrate 11. Well region 20 is formed in accordance with known techniques and includes a dopant (e.g., N-type or P-type) that is opposite to substrate 11, and has a (first) relatively low dopant concentration. In most cases, substrate 11 also includes a (second) well region 21 that is of the same conductivity type as substrate 11 (i.e., opposite to well region 20).

Schottky diode 30 is formed entirely on the portion of upper surface 12 that is located over well region 20, and is generally made up of a metallic structure 32, a backside contact structure 34, and an isolation structure 50 that is generally positioned between metallic structure 32 and contact structure 34. Metallic structure 32 includes a (first) silicide (Schottky barrier) structure 42 that is formed on upper surface 12 over a portion (first doped region) 22 of well region 20. Backside contact structure 34 includes a second silicide (Ohmic contact) structure 44 formed on upper surface 12 over a relatively highly doped contact region (second doped region) 24 of well region 20, where the dopant used to form contact region 24 is the same (i.e., either N-type or P-type) as the dopant used to form well region 20. Isolation structure 50 is located on upper surface 12 over another portion (third doped region) 26 of well region 20 between first silicide structure 42 and second silicide structure 44. Peripheral isolation structures 15 (e.g., silicon trench isolation (STI) or local oxidation of silicon (LOCOS)) are formed around Schottky diode 30.

FET 70 is a substantially conventional CMOS transistor that is also formed on substrate 11 in well region 21 using CMOS processing techniques. FET 70 generally includes a gate structure 72 positioned between a first terminal (e.g., source) 74A and a second terminal (e.g., drain) 74B. Peripheral isolation structures 15 are formed around FET 70.

In accordance with the present invention, Schottky diode 30 is entirely or substantially fabricated using standardized diffusions and structures that are utilized in the fabrication of FET 70. Specifically, in accordance with an aspect of the present invention, isolation structure 50 of Schottky diode 30 includes a polysilicon structure and associated oxide structures that are substantially identical to gate structure 72 of FET 70. Further, in accordance with another aspect of the present invention, anode 32, cathode 34, and terminals 74A and 74B include similar structures that are formed simultaneously. Moreover, in accordance with yet another aspect of the present invention, backside contact 34 and terminals 74A and 74B are located over diffusions that are formed simultaneously in substrate 11. By forming the various structures of Schottky diode 70 in accordance with at least one of these aspects, the present invention provides a highly efficient method for fabricating Schottky diodes with minimal interruption to an established CMOS fabrication flow, thus minimizing the manufacturing costs associated with ICs (e.g., RF and MS CMOS ICs) that utilize Schottky diodes. These aspects will now be described in additional detail.

In accordance with the first aspect, isolation structure 50 of Schottky diode 30 is substantially identical to gate structure 72 of FET 70. Isolation structure 50 of Schottky diode 30 includes a thin lower oxide layer 55A, a doped polycrystalline silicon (herein "polysilicon") structure 56A formed on lower oxide layer 55A, oxide (sidewall spacer) structures 58A and 59A formed on opposing side walls of polysilicon structure 56A, and an optional silicide structure 46A formed on an upper surface of polysilicon structure 56A. Similarly, gate structure 72 of FET 70 includes a gate oxide layer 55B, a doped polysilicon gate structure 56B, sidewall spacer structures 58B and 59B, and a silicide structure 46B. Thin lower oxide layer 55A and gate oxide layer 55B are formed simultaneously using known techniques. Polysilicon structure 56A and gate structure 56B are then simultaneously formed on the respective oxide layers using known polysilicon processing techniques. Oxide structures 58A and 59A and sidewall spacers 58B and 59B are then simultaneously formed using known sidewall spacer fabrication techniques. Finally, silicide structures 46A and 46B are then simultaneously formed using known silicide formation techniques. By forming isolation structure 50 using the same structures and processes utilized to form gate structure 72, the fabrication of Schottky diode 30 can be carried out simultaneously with the formation of FETs during a standardized CMOS process flow.

According to the second aspect of the present invention, anode 32 and cathode 34 of Schottky diode 30 are formed using the same structures and process steps as those used to form terminals 74A and 74B of FET 70. In particular, silicide structures 42 and 44 of Schottky diode 30 are formed using the same silicide material (e.g., cobalt silicide ($CoSi_2$), titanium silicide ($TiSi_2$), or nickel silicide ($NiSi_2$)) that are used to form silicide structures 48A and 48B of terminals 74A and 74B. In addition, both terminals 32 and 34 of the Schottky diode 30 include metallic contact plugs 62 and 64 that are formed simultaneously with metallic contact plugs 68A and 68B of terminals 74A and 74B, respectively. By forming the anode/cathode structures of Schottky diode 30 using the same structures and processes utilized to form terminals 74A and 74B of FET 70, the fabrication of Schottky diode 30 can be carried out simultaneously with the formation of FETs during a standardized CMOS process flow.

According to the third aspect, the backside contact 34 of Schottky diode 30 is formed on doped contact region 24 using the same dopant concentrations and the same processing steps as those used to form source/drain diffusion regions 28A and 28B. In particular, contact region 24 includes a heavily doped portion 23H that is formed simultaneously with heavily doped drain (HDD) regions 27H of terminals 74A and 74B, and a lightly doped portion 23L that is located under oxide structure 59A and formed simultaneously with lightly doped drain (LDD) regions 27L of terminals 74A and 74B. The doping processes and concentrations utilized to form suitable HDD regions 27H and LDD regions 27L are well established. These same processes and concentrations are utilized in the formation of contact region 24, thus facilitating the fabrication of Schottky diode 30 simultaneously with the formation of FET 70 during a standardized CMOS process flow.

As set forth above, each structure of Schottky diode 30 corresponds to an associated structure of CMOS FET 70, thereby allowing the fabrication of each of these structures with minimal interruption to a standardized CMOS (or BiCMOS) process flow. Thus, the use these Schottky diode structures reduces fabrication costs by eliminating additional steps associated with forming these structures. While fabrication costs of CMOS IC device 10 is minimized by incorporating all of the structures described above, the benefits of reduced fabrication costs may be achieved by using one or more of these structures in combination with conventional Schottky diode structures.

Referring again to FIG. 1, the operating characteristics of Schottky diode 30 will now be described. First, the Schottky barrier of Schottky diode 30, which is formed at the junction between metallic silicide structure 42 and well portion 22, is separated from the backside contact 34 by a width W defined by isolation structure 50. Because isolation structure 50 is formed using known CMOS gate fabrication techniques, width W can be made substantially smaller (narrower) than conventional Schottky diodes that utilize, e.g., STI-based isolation structures. In addition, isolation structure 50 is formed entirely over upper surface 12, in contrast to conventional STI-based isolation structures that extend into substrate 11. Consequently, Schottky diode 30 exhibits substantially lower series resistance and parasitic capacitance, which improves the efficiency of the diode, particularly at very low operating voltage, e.g., 1 Volt. Note that the Schottky diode structure of the present invention has enhanced electric fields at the periphery of the metallic region. This tends to reduce the effective turn-on voltage, which is desirable for low voltage operations, but it tends to increase the leakage under reverse bias conditions, which is undesirable. However, the overall balance of improved low voltage characteristics and reduced series resistance are deemed by the inventors as an acceptable trade off.

Figure 2:
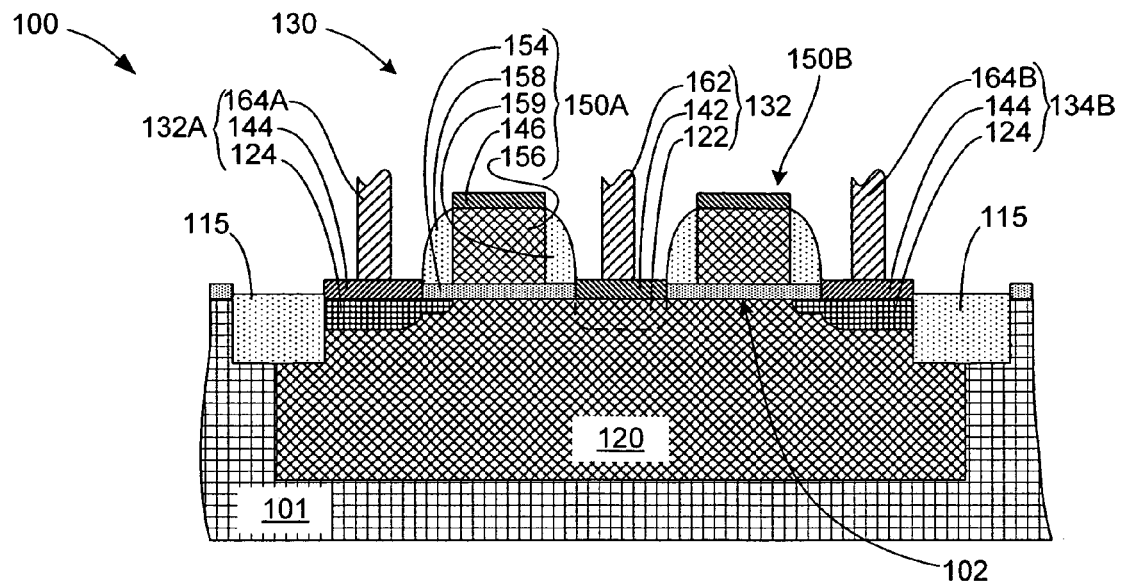
FIG. 2 is a cross-sectional side view showing a Schottky diode according to another embodiment of the present invention.
Figure 3:
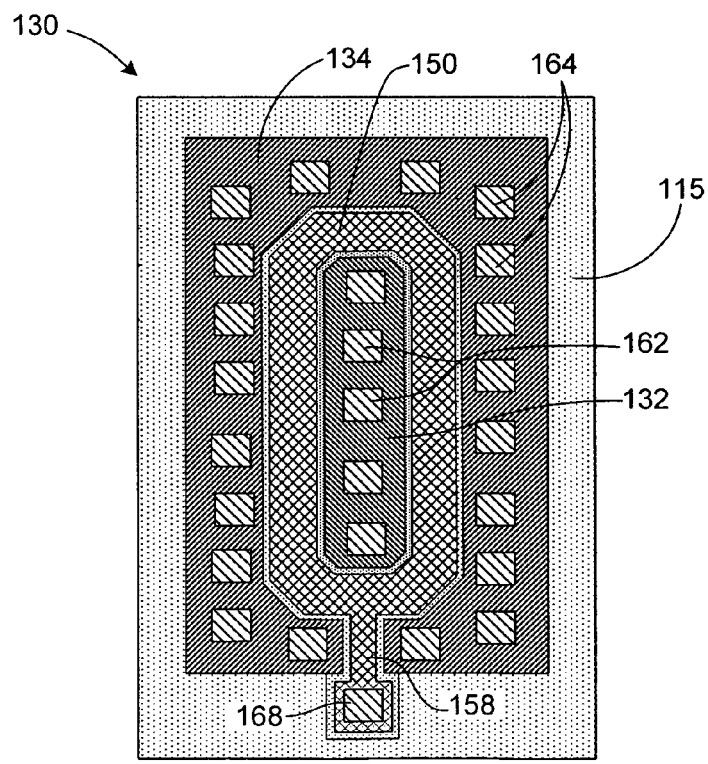
FIG. 3 is modified top view showing the Schottky diode of FIG. 2 in additional detail.

FIG. 2 is a cross-sectional side view showing a CMOS IC 100 including a Schottky diode 130 according to an exemplary embodiment of the present invention. FIG. 3 is a modified top view showing Schottky diode 130 in additional detail.

Referring to FIGS. 2 and 3, Schottky diode 130 is fabricated on an N-well 120 that occupies a region of a P-type monocrystalline silicon substrate 101. N-well 120 has a first, relatively low concentration of an N-type dopant, and is entirely surrounded by P-substrate 101. Formed along the outside peripheral edges of N-well 120 is at least one STI structure 115. Formed inside N-well 120 is at least one implant 124 that is also exposed on upper surface 102, and includes a heavily doped (N+) region and a lightly doped (N−) region.

According to an aspect of the present embodiment, Schottky diode 130 includes a central Schottky barrier metallic structure 132 and an annular backside contact structure (Ohmic contact) 134 that surrounds central structure 132, with isolation structure 150 being positioned between Schottky metallic structure 132 and backside contact structure 134. As indicated in FIG. 2, Schottky barrier structure 132 includes a (first) metal or metallic silicide structure 142 that is formed on a (first) portion of N-well 120, and at least one metal contact 162 extending from an upper surface of silicide structure 142. As indicated in FIG. 3, in one embodiment, Schottky barrier structure 132 is elongated, and includes several metal contacts 162. Backside contact structure 134 (which, in FIG. 2, includes side portions 134A and 134B), includes a second silicide structure 144 formed on an O-shaped, relatively highly doped (N+) region 124 of well 120, and multiple metal contacts 164 (e.g., metal contacts 164A and 164B) extending upward from silicide structure 144. As indicated in FIG. 3, backside contact structure 134 extends around Schottky barrier structure 132, with O-shaped isolation structure 150 positioned between an outer peripheral edge of Schottky barrier structure 132 and an inside peripheral edge of backside contact structure 134. As indicated in FIG. 2, isolation structure 150 (which includes side portions 150A and 150B) includes a lower thin oxide layer 154, a polysilicon structure 156 formed on oxide layer 154, oxide structure 158 and 159 formed on side walls of polysilicon structure 156, and a silicide structure 146 formed on an upper surface of polysilicon structure 156. As indicated in FIG. 3, in accordance with an embodiment, isolation structure includes an arm portion 158 that extends through a gap formed in backside contact structure 134, and a metal contact 168 formed on the silicide structure to facilitate electrical connection to the gate-type isolation structure. Metal contact 168 may be connected to a suitable bias voltage source, or it may be connected directly the backside contacts, which will assure zero bias with respect to N-well 120 and minimize parasitic capacitance.

The configuration shown in FIG. 3 assures low series resistance by providing current flow from the Schottky barrier structure 132 to backside contact 134 in two directions. Closing the gate-type isolation structure 150 to surround the Schottky barrier structure provides full isolation of that structure and serves to assure its reproducibility in manufacture. A simple stripe structure, with the cathode and anode separated by an isolating gate structure, but with the ends of the Schottky barrier defined by STI or LOCOS, would retain most of the advantages of this invention.

FIGS. 4(A) to 5(F) are simplified cross-sectional side views illustrating a process for generating Schottky diodes similar to those described above using a standard CMOS fabrication flow.

Figure 4A:
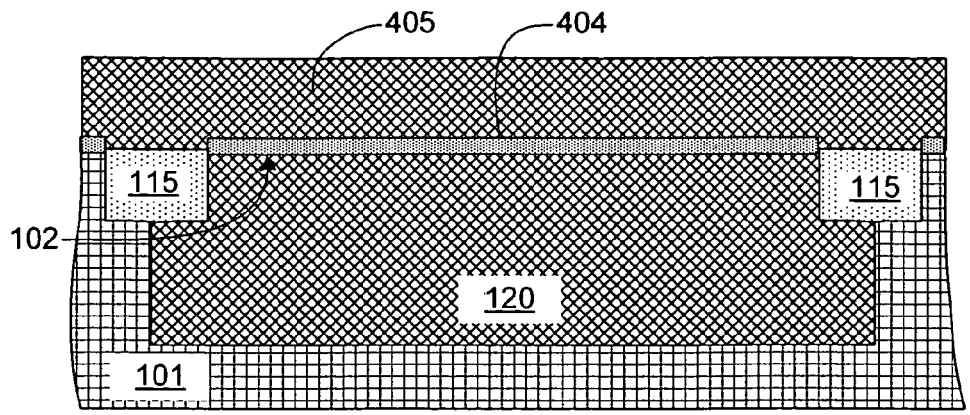
FIGS. 4(A), 4(B), 4(C), 4(D), 4(E) and 4(F) are cross-sectional side views showing a process for fabricating Schottky diodes according to another embodiment of the present invention.

Referring to FIG. 4(A), the starting material is a P-type silicon wafer 101. A thick silicon-dioxide film (about 350 nm) is formed and patterned on surface 102 of the silicon wafer using well-known STI techniques to form the isolation structures 115 between adjacent devices. A series of photo-lithography and ion implantation procedures are then performed according to known techniques to form N-well 120. Wafer 101 is then annealed by RTA (rapid-thermal-anneal) for implant activation. After the well formation, a thin layer 404 of silicon-dioxide is formed over surface 102, and a 200 nm film of polycrystalline silicon 405 is deposited over thin oxide layer 404. Layer 404 is either 3 nm or 7 nm thick, and is formed by oxidation of the exposed silicon surface 102, followed by nitridation (inclusion of nitrogen atoms in the film) and anneal steps.

Figure 4B:
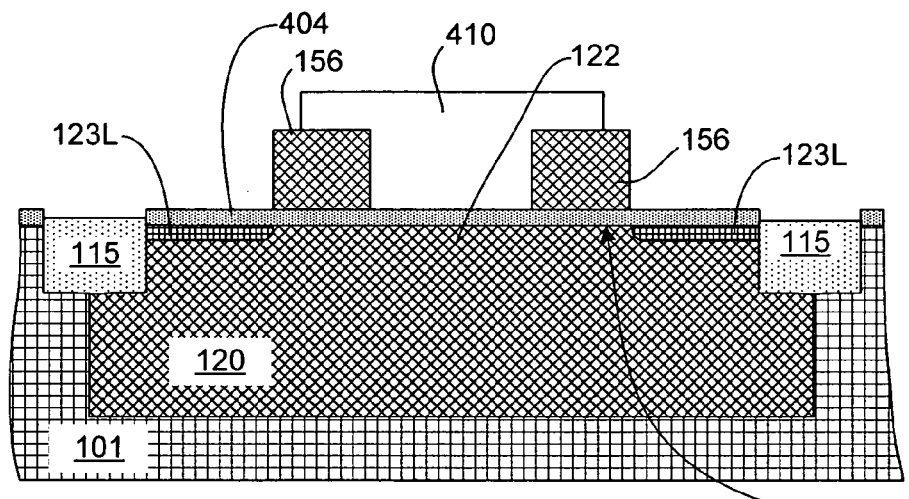

As indicated in FIG. 4(B), polycrystalline silicon 405 is patterned using known techniques to form poly-defined Schottky-diode isolation structures (spacers) 156. The polysilicon patterning step is followed by an oxidation step to form a thin oxide film (not shown) on the surface of isolation structures 156. A mask 410 is then formed over central region 122, and a lightly-doped extension implant process is performed according to known techniques to form lightly doped regions 123L. Mask 410 is subsequently removed.

Figure 4C:
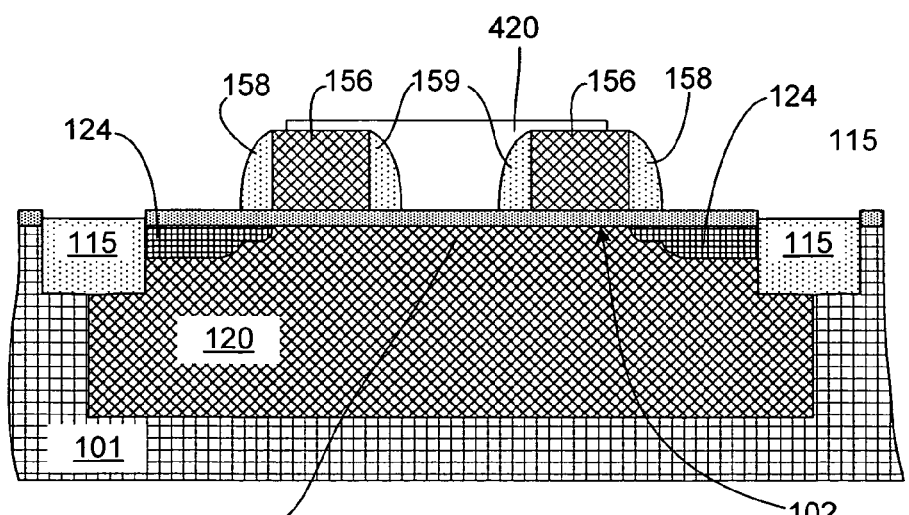

Referring to FIG. 4(C), after the extension implant step, side-wall spacers 158 and 159 are formed on the side walls of polysilicon structures 158 by deposition of oxide and nitride films, followed by an etch-back process, all according to known techniques. After spacer formation, lithography is used to form a mask 420 over central region 122, and high-dose N-type implants are formed in the exposed silicon, thereby completing the formation of Ohmic contact region 124. These implants are also used for doping of polysilicon structures 156. After the implant step is completed, wafer 101 is annealed by RTA for implant activation.

Figure 4D:
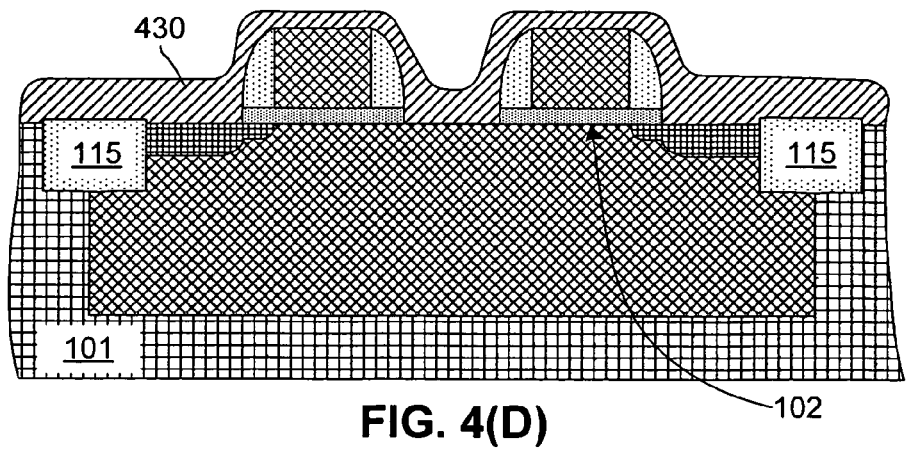

Referring to FIG. 4(D), in the next process module a self-aligned film of cobalt silicide is formed over selected regions of the Schottky-diode device. The process may include depositing and patterning a silicon oxide film over selected regions of wafer 101 to form a silicide-blocking mask (not shown). The silicide blocking mask is not important to this invention. Then wafer 101 is treated by an oxide etch process (in a dilute HF solution) to remove any thin silicon oxide film that may remain on surfaces intended for silicidation. The etch removes only a very thin layer of the oxide, so thick layers of oxide such as the STI isolation structures 115 and the silicidation blocking mask are not significantly affected. A film 430 of cobalt is then deposited on the wafer by sputtering. It is common in the art to cover the cobalt with a protective layer, and then wafer 101 is subjected to a rapid thermal treatment at about 480° C. During this thermal treatment the cobalt reacts with exposed surfaces of silicon (and polysilicon) to form cobalt silicide ($CoSi_2$). After the first thermal treatment wafer 101 is treated by wet-etch in sulfuric acid to remove any un-reacted cobalt. After this the wafer is subjected to a second rapid thermal treatment, at about 650° C., to establish the correct stoichiometry and crystal structure, which minimizes the resistivity of the cobalt silicide film.

Figure 4E:
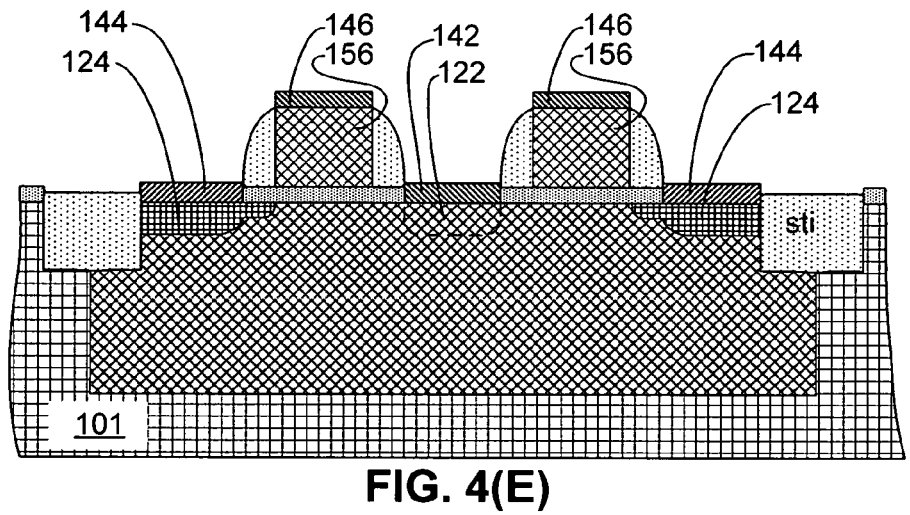

FIG. 4(E) shows the resulting $CoSi_2$ structures 142, 144, 146 respectively formed over substrate regions 122 and 124, and on polysilicon structures 152.

Figure 4F:
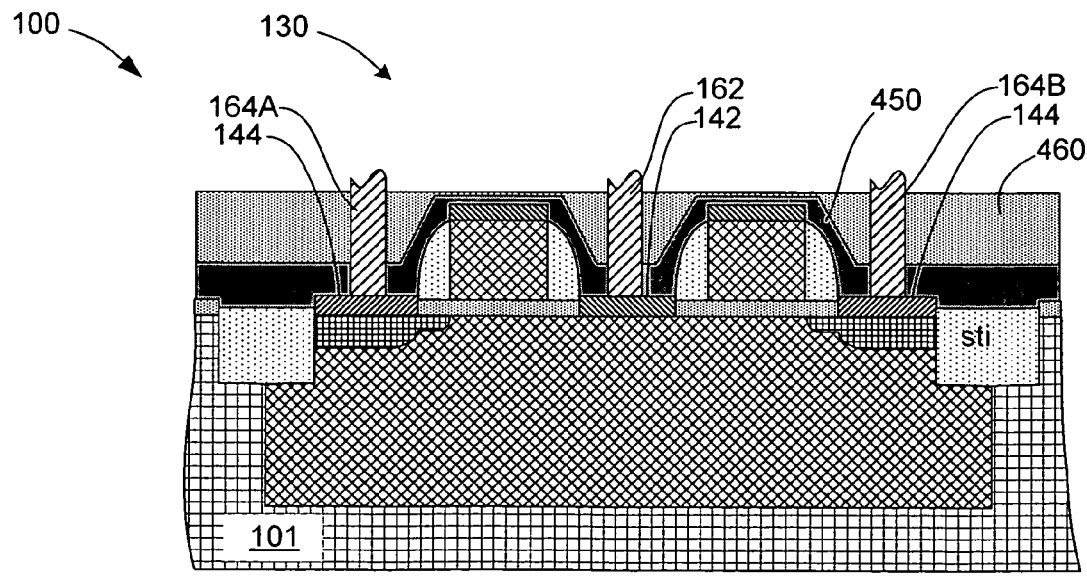

FIG. 4(F) shows the completed Schottky diodes 130. After silicide formation, a first dielectric layer is formed by deposition of a thin nitride film 550, followed by a 1000 nm thick, doped oxide (BPSG) film 460. The BPSG film is planarized by CMP, and a cap layer of oxide (not shown) is deposited to achieve total dielectric thickness of about 700 nm. Contact holes are etched through the dielectric layer, and then filled by a Titanium/titanium-nitride (Ti/TiN) liner film, followed by tungsten for completely filling the metal electrode (contacts) 162 and 164 to $CoSi_2$ structures 142 and 144, respectively. Excess tungsten is removed by CMP leaving tungsten inside the contact holes, forming contact plugs. A stack of Ti-TiN (total 50 nm), Aluminum-copper (500 nm) and TiN (20 nm) is deposited over the wafer surface to form the first interconnect layer (now shown) that provides contact to the various metal electrodes using known techniques. Similar methods are used to form additional metal layers over the first metal interconnect layer. After the desired number of interconnect layers are formed, thick layers of oxide and nitride are deposited on the wafer to form a protective passivation layer.

Although the present invention has been described with respect to certain specific embodiments, it will be clear to those skilled in the art that the inventive features of the present invention are applicable to other embodiments as well, all of which are intended to fall within the scope of the present invention. For example, the cobalt silicide may be formed on a P-well rather than an N-well. Materials other that $CoSi_2$, like $TiSi_2$ or $NiSi_2$ may be employed. Other variations may include the total exclusion of the LDD implant from the Schottky diode structure, or the addition of a customized implant to establish a surface carrier concentration that is not provided by implants implicit in the base CMOS process. This invention also applies when the CMOS process comprises two different well types, one for the NMOS device and one for the PMOS device, which is common in contemporary processes.

The invention claimed is:

1. A method for fabricating a complimentary complementary metal-oxide-semiconductor integrated circuit (CMOS IC) device on a substrate having an upper surface, wherein the method comprises:
   forming a first well region and a second well region in the substrate such that a first peripheral isolation structure is formed around the first well region and a second peripheral isolation structure is formed around the second well region;
   simultaneously forming a Schottky diode on the first well region and a field effect transistor (FET) in the second well region,
   wherein the Schottky diode includes a Schottky barrier structure and a backside contact structure formed on the upper surface over first and second doped regions of the substrate, respectively, and an isolation structure formed on the upper surface and located between the Schottky barrier and backside contact structures over a third doped region of the substrate,
   wherein the FET includes first and second terminal structures formed on the upper surface of the substrate over fifth and sixth doped regions disposed in the second well region of the substrate, respectively, and a gate structure formed on the upper surface of the substrate and located between the first and second terminal structures, and
   wherein simultaneously forming the Schottky diode and the FET comprises depositing a layer of polycrystalline silicon over the upper surface of the substrate, and then etching the layer of polycrystalline silicon such that a first portion of said layer is located over the third doped region and forms a first polycrystalline silicon structure of the isolation structure of the Schottky diode, and such that a second portion of said layer is located over the second well region and forms a second polycrystalline silicon structure of the gate structure of the FET.

2. The method according to claim 1, wherein simultaneously forming the Schottky diode and the FET further comprises forming oxide spacer structures on side walls of the first and second polycrystalline silicon structures.

3. The method according to claim 1, wherein simultaneously forming the Schottky diode and the FET further comprises simultaneously doping the second doped region the fifth and sixth doped regions of the substrate such that each of the second doped region and the fifth and sixth doped regions include a heavily doped region and a lightly doped region.

4. The method according to claim 1, wherein simultaneously forming the Schottky diode and the FET further comprises simultaneously forming first and second silicide structures over the first and second doped regions, respectively, and third and fourth silicide structures over the fifth and sixth doped regions, respectively.

5. The method according to claim 1, wherein simultaneously forming the first, second, third and fourth silicide structures comprises forming one of cobalt silicide, titanium silicide, and nickel silicide.

6. A method for fabricating a complimentary complementary metal-oxide-semiconductor integrated circuit (CMOS IC) device on a substrate having an upper surface, wherein the method comprises:
   forming a first well region in the substrate having a first conductivity type;
   forming a second well region in the substrate separated from the first well region such that the first and second well regions are noncontiguous, wherein the second well region has a second conductivity type that is opposite to the first conductivity type;
   simultaneously forming a Schottky diode on the first well region and a field effect transistor (FET) in the second well region of the substrate,
   wherein the Schottky diode includes a Schottky barrier structure and a backside contact structure formed on the upper surface over first and second doped regions of the substrate, respectively, and an isolation structure formed on the upper surface and located between the Schottky barrier and backside contact structures over a third doped region of the substrate,
   wherein the FET includes first and second terminal structures formed on the upper surface of the second well region over fifth and sixth doped regions of the substrate, respectively, and a gate structure formed on the upper surface of the substrate and located between the first and second terminal structures, and
   wherein simultaneously forming the Schottky diode and the FET comprises depositing a layer of polycrystalline silicon over the upper surface of the substrate, and then etching the layer of polycrystalline silicon such that a first portion of said layer is located over the third doped region and forms a first polycrystalline silicon structure of the isolation structure of the Schottky diode, and such that a second portion of said layer is located over the second well region and forms a second polycrystalline silicon structure of the gate structure of the FET.

* * * * *